(12) United States Patent
Gutsche et al.

(10) Patent No.: US 7,081,383 B2
(45) Date of Patent: Jul. 25, 2006

(54) METHOD FOR FABRICATING MEMORY CELLS AND MEMORY CELL ARRAY

(75) Inventors: Martin Gutsche, Dorfen (DE); Franz Kreupl, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/952,371

(22) Filed: Sep. 29, 2004

(65) Prior Publication Data
US 2005/0095780 A1    May 5, 2005

(30) Foreign Application Priority Data
Sep. 30, 2003  (DE) ............................... 103 45 394

(51) Int. Cl.
*H01L 21/8242* (2006.01)
*H01L 21/20* (2006.01)
(52) U.S. Cl. ...................... 438/243; 438/386
(58) Field of Classification Search ........... 438/243, 438/386, 239, 622, 634, 637, 391, 689
See application file for complete search history.

(56) References Cited

U.S. PATENT DOCUMENTS

| | | | |
|---|---|---|---|
| 6,352,902 B1 * | 3/2002 | Aitken et al. ............... 438/243 |
| 2003/0010089 A1 | 1/2003 | Holmes | |
| 2004/0137730 A1 * | 7/2004 | Kim et al. ................... 438/689 |
| 2005/0095780 A1 * | 5/2005 | Gutsche et al. ............. 438/243 |
| 2005/0196950 A1 * | 9/2005 | Steinhogl et al. ........... 438/622 |

* cited by examiner

*Primary Examiner*—Walter L. Lindsay, Jr.
(74) *Attorney, Agent, or Firm*—Morrison & Foerster LLP

(57) ABSTRACT

A method for producing memory cells, in which an electrically conductive substrate is provided, a trench structure or cup structure with side walls and a base is formed in or on the substrate, a first insulation layer is deposited at the side walls, a capacitor material is deposited on the base, a nanostructure is grown starting from and electrically connected to the catalyst material deposited on the base, a second insulation layer is deposited on the nanostructure and on the base, and finally an electrically conductive layer is deposited as a counterelectrode on the first insulation layer and second insulation layer.

19 Claims, 2 Drawing Sheets

Figure 1A:
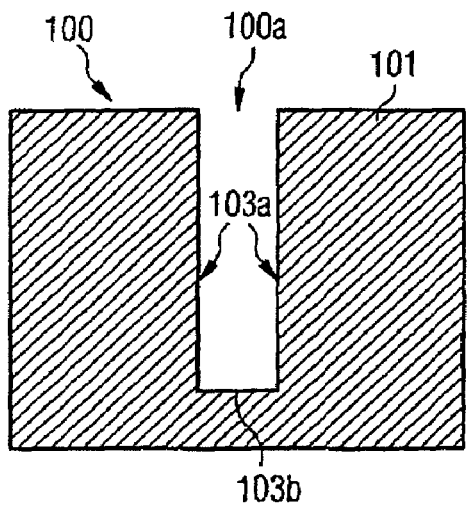

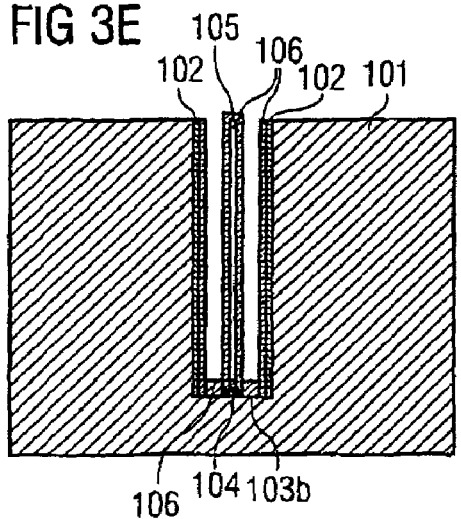
FIG 3E
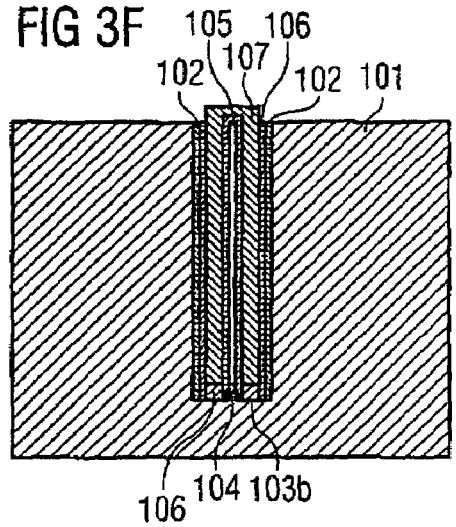
FIG 3F
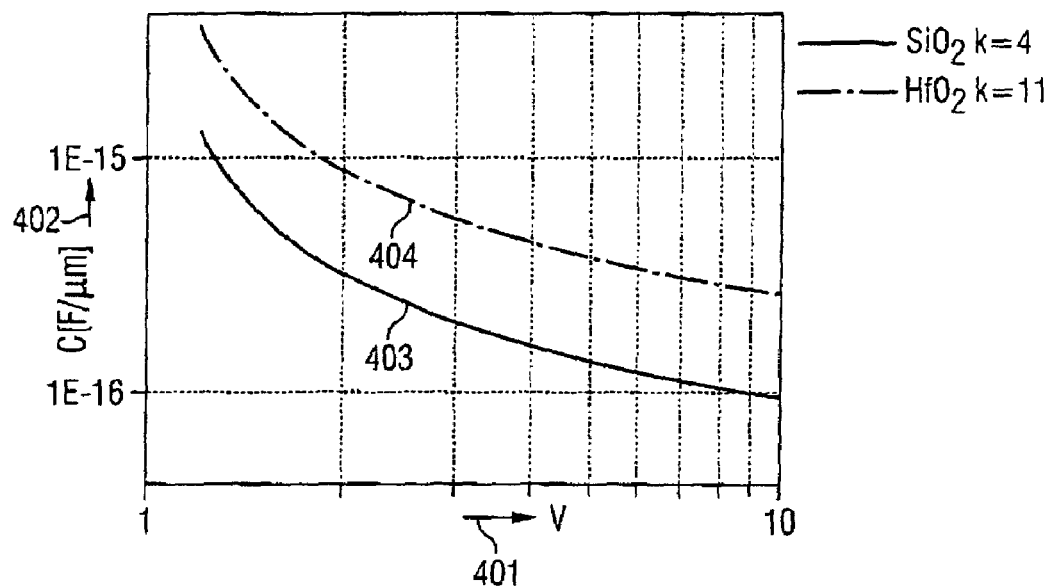
FIG 4A State of the Art
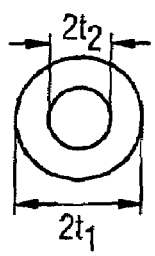
FIG 4B State of the Art

METHOD FOR FABRICATING MEMORY CELLS AND MEMORY CELL ARRAY

CLAIM FOR PRIORITY

This application claims the benefit of priority to Application No. 103 45 394.6, filed Sep. 30, 2003, the contents of which are hereby incorporated by reference in its entirety.

TECHNICAL FIELD OF THE INVENTION

The present invention relates to memory cells which are used in memory cells arrays of integrated circuits, and relates in particular to a method for fabricating memory cells in electrically conductive substrates.

BACKGROUND OF THE INVENTION

FIG. 4 shows a graph which shows a specific capacitance, i.e. a capacitance per unit length (farad/μm) as a function of a radius ratio V of a cylindrical capacitor, the capacitance per unit length being illustrated on the cylinder axis. A radius ratio V is therefore: $V=r_1/r_2$ in accordance with FIG. 4(b). FIG. 4(a) shows the corresponding capacitance curves, i.e. a first capacitance curve 403 for a dielectric with a low dielectric constant, for example k=4, and a second capacitance curve 404 for a dielectric with a high capacitance, for example k=11. The curve for the specific capacitance 402 is in each case plotted against the radius ratio $V=r_1/r_2$, which is defined in accordance with FIG. 4(b). FIG. 4(b) illustrates a cross section through the cylinder perpendicular to its axis.

For capacitive elements of this type to be used as memory cells in DRAMs (Dynamic Random Access Memories), it is necessary to provide a minimum capacitance for storing electric charge.

It is known to the average person skilled in the art that the required capacitance to maintain a signal that can be measured when the memory cell is read and is higher than a thermal noise level, depending on the particular embodiment of the DRAM, must be at least 29 to 35 fF (femtofarad), i.e. $30 \times 10^{-15}$ farad. As shown in FIGS. 4(a) and (b), there are limits on the extent to which a capacitance can be increased by varying the radius ratio V. This means that it is not possible to obtain a radius ratio V of the order of magnitude of 1, since a minimum thickness of the dielectric forming the capacitor has to be provided.

Furthermore, it is not expedient to provide arrangements extending along the axis of the cylindrical capacitor in order to increase the capacitance. Very long or high cylindrical capacitors can only be produced with very great difficulty or using extremely expensive production processes, for manufacturing technology reasons. Since the capacitive elements which form the memory cells are produced by etching trenches or cups into a silicon substrate or by providing a cup in a structure above the substrate surface in a conventional way, conventional methods have attempted to etch or pattern trenches or cups of this type down to ever greater depths or to "roughen" their side walls in order to achieve larger electrode surface areas and therefore higher capacitances in the capacitive elements.

Since capacitive elements of this type are fabricated using lithographic processes, conventional processes are not expediently suitable for providing a sufficient increase in capacitance.

SUMMARY OF THE INVENTION

The present invention provides a method for fabricating memory cells which are formed from capacitive elements which make it possible to create memory cells with an increased capacitance while continuing to use standardized lithography processes.

More specifically, the invention relates to a method for fabricating memory cells in which an electrically conductive substrate is provided, a trench structure which has side walls and a base is etched into the substrate, an insulation layer is deposited at the side walls of the trench structure, and then a counterelectrode in the form of an electrically conductive layer is applied in the trench structure which has been coated with the insulation layer.

In one embodiment of the invention, increasing the capacitance of capacitive elements which are provided as memory cells in memory cell arrays by increasing surface areas of the capacitive elements formed in a predetermined trench structure by the introduction of nanostructures. In this context, one significant advantage of the method of the present invention is that standardized lithography processes are used to provide a conventional trench structure, while sub-lithographic features are introduced in the form of nanostructures, which may be formed as nanotubes and/or nanowires.

Nanostructures of this type advantageously increase an electrode surface area at least of an electrode forming the capacitive element, in such a manner that the total capacitance of the capacitive element and therefore a storage capacity of the memory cell is increased. Nanostructures of this type can advantageously grow at the base or at side faces of the conventional trench structure, resulting in a considerable increase in the capacitance. The method according to the invention for fabricating memory cells substantially includes:

a) providing an electrically conductive substrate;

b) etching a trench structure i.e. trenches which have side walls and a base, into the substrate, or forming a cup structure with a cup shape from material which is applied to the substrate;

c) depositing a first insulation layer at the side walls of the trench structure;

d) depositing a catalyst material on the base of the trench structure, in such a manner that an electrical connection is provided between the electrically conductive substrate and the catalyst material;

e) growing a nanostructure within the trench structure, starting from and electrically connected to the catalyst material deposited on the base of the trench structure;

f) depositing a second insulation layer on the nanostructure which has grown in the trench structure and on the base of the trench structure; and g) depositing an electrically conductive layer on the first insulation layer and second insulation layer.

According to a preferred embodiment of the present invention, the electrically conductive substrate or a cup structure is provided from silicon. Furthermore, it is possible to form trench or cup structures with metallic walls. It is preferable for the trench structure, which has the side walls and the base, to be etched into the substrate by means of an anisotropic etching process. The cup structure is expediently produced by a succession of suitable deposition and etching processes as are known to the person skilled in the art.

According to a further preferred embodiment of the present invention, the trench structure which has the side walls and the base in the substrate is substantially rectangular in cross section.

According to yet another preferred embodiment of the present invention, the deposition of the first insulation layer is carried out at the side walls of the trench structure and not at the base of the trench structure, preferably by virtue of the side walls being coated by means of a depletion process, for example by means of a non-conformal ALD (ALD=Atomic Layer Deposition) process.

According to yet another preferred embodiment of the present invention, deposition of the catalyst material on the base of the trench structure is carried out by electrodeposition or by means of a vapor deposition process.

According to yet another preferred embodiment of the present invention, the first insulation layer, which is deposited at the side walls of the trench structure, is formed as a dielectric with a high dielectric constant. The dielectric is preferably formed from a silicon dioxide ($SiO_2$), SiN, $Al_2O_3$, $Ta_2O_5$, $HfO_2$ or other conventional high-k materials (i.e. materials with a high dielectric constant), in which context, by way of example, $SiO_2$ has a dielectric constant of k=4 and $Al_2O_3$ has a dielectric constant of approximately k=11.

According to yet another preferred embodiment of the present invention, the catalyst material which is deposited on the base of the trench structure includes at least one iron group, preferably Fe, Ni or Co, in such a manner that the nanostructure is formed as a carbon nanotube (CNT). Furthermore, it is advantageous to form a multiplicity of CNTs which grow as a tuft.

According to yet another preferred embodiment of the present invention, the catalyst material which is deposited on the base of the trench structure is deposited from a silicide-forming material, such as for example Au, Pt or Ti. In this embodiment, it is preferable for silicon nanowires to be formed as the nanostructure.

According to yet another preferred embodiment of the present invention, the nanostructure from the and electrically connected to the catalyst material deposited on the base of the trench structure grows centrally within the trench structure. Furthermore, it is advantageous if the nanostructure from the and electrically connected to the catalyst material deposited on the base of the trench structure, within the trench structure, grows eccentrically and/or at the side walls, coated with the first insulation layer, of the trench structure. An advantage of both the situations outlined above is that the overall surface area of the capacitive element is increased.

According to yet another preferred embodiment of the present invention, the second insulation layer, which is deposited on the nanostructure grown in the trench structure and on the base of the trench structure, is formed as a dielectric with a high dielectric constant.

According to yet another preferred embodiment of the present invention, the first and/or second insulation layers are deposited by means of an atomic layer deposition process. An atomic layer deposition process of this type preferably makes it possible to achieve extremely thin layers which are highly conformal. It is preferable for the first and/or second insulation layers to be provided, for example, from an $SiO_2$ material, an SiN material or from an $HfO_2$ material.

According to yet another preferred embodiment of the present invention, the electrically conductive layer which is deposited on the first and second insulation layers and which serves as counterelectrode to the electrode connected to the electrically conductive substrate is provided from a polysilicon material. It is expedient if the electrically conductive layer which is deposited on the first and second insulation layers also fills up all the space which remains in the trench structure after the above steps a) to f) have been carried out. Furthermore, it is possible to provide for a metal to be deposited as counterelectrode, in which case once again the ALD (ALD=Atomic Layer Deposition) process is preferred.

In a further aspect, the invention comprises a memory cell which is produced using the process according to the invention.

In yet a further aspect, the present invention comprises a memory cell array which is composed of memory cells produced using the process according to the invention.

BRIEF DESCRIPTION OF THE INVENTION

Figure 1B:
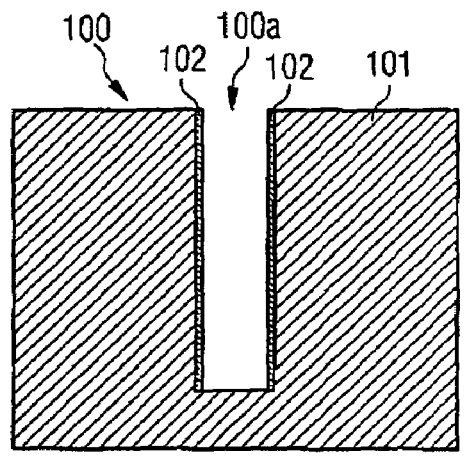

Exemplary embodiments of the invention are illustrated in the drawings and explained in more detail in the description which follows. In the drawings:

FIGS. 1A–B show the first two process steps involved in the method according to the invention for fabricating memory cells.

Figure 2C:
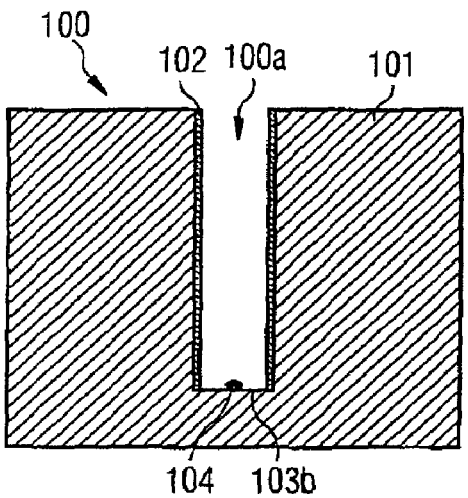
Figure 2D:
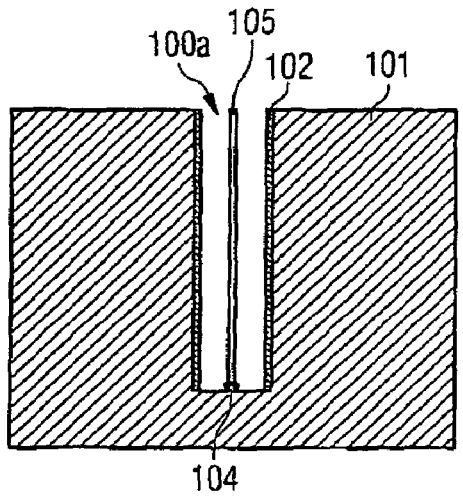

FIGS. 2C–D show two further process steps, which follow the process steps illustrated in FIG. 1 and in which a catalyst material is deposited and a nanostructure grows within the trench structure.

FIGS. 3E–F show further process steps, which follow the process steps shown in FIG. 2.

FIGS. 4A–B show a graph illustrating curves for different specific capacitances as a function of a radius ratio of a cylindrical capacitor arrangement in accordance with the prior art.

In the figures, identical reference symbols denote identical or functionally equivalent components or steps.

DETAILED DESCRIPTION OF THE INVENTION

FIG. 1 to 3 show the method for fabricating memory cells during six main steps a) to f). One main aspect of the method according to the invention is the fabrication of memory cells with an increased capacitance. Compared to the conventional cylindrical capacitor arrangement shown with reference to FIG. 4, it should be noted that with a 5 nm thick hafnium dioxide layer ($HfO_2$ material), the method according to the invention increases the capacitance if, for example, a nanostructure with a diameter of 20 nm is introduced into the trench structure. In this case, the increase in capacitance is approx. 10–16 fF (femtofarad, $10^{-15}$ farad) if the trench structure (i.e. the trench) is approx. 8 μm deep.

With increasing miniaturization of electronic components, it is important to increase the capacitance of the memory cells which form a memory cell array. Standardized lithography processes are currently used even for the smallest microelectronic structures, and the lithography places a limit on the extent to which the feature size can be reduced. According to the invention, the method uses a technique which allows sub-lithographic features to be introduced into the conventional trench structures. Sub-lithographic features, i.e. features which have feature sizes smaller than the feature sizes that can be achieved using standard lithography, can be achieved by the use of nanotubes and/or nanowires. The following text describes the method according to the invention for fabricating memory cells with reference to steps a) to f) of FIGS. 1 to 3.

FIG. 1(a) shows that a trench structure 100a has been etched into a substrate 101, which is preferably provided from an electrically conductive material, preferably from a silicon material, and this trench structure then serves as a basis for the formation of a memory cell 100. It should be noted that, although these figures illustrate the fabrication of just one memory cell, a large number of memory cells can be fabricated in parallel. The trench structure may have a rectangular cross section or a round cross section.

The method according to the invention is not restricted to one specific cross-sectional shape of the trench structure. As defined in FIG. 1, process step a), the trench structure 100a has side walls 103a and a base 103b, while the trench structure is open toward the top side of the substrate 101. It is preferable for the trench structure shown in FIG. 1, process step a) to be formed by an anisotropic etching, in such a manner that the side walls 103a are substantially parallel to one another.

The process then advances to a process step b), which is likewise shown in FIG. 1. In process step b), a first insulation layer 102 is applied to the side walls 103a of the trench structure. It should also be noted that, for subsequent contact-connection of the silicon substrate, the base 103b of the trench structure 100a is not coated with the insulation layer 102. Preferably, although not exclusively, the insulation layer 102 is applied by an atomic layer deposition process. In this way, it is possible to produce very thin insulation layers which, as has been explained above with reference to FIG. 4, lead to high individual capacitances. The first insulation layer 102 is preferably formed as a dielectric with a high dielectric constant K=4 ≸60.

FIG. 2 shows two further process steps which follow the process steps described with reference to FIG. 1. In order, according to the invention, to allow the growth of a nanostructure, a catalyst material 104 is required, catalyzing growth of nanostructures in the form of nanotubes and/or nanowires. The process step c) shown in FIG. 2 reveals that the catalyst material 104 has been applied to the base 103b of the trench structure 100a, for example by means of electrodeposition or a vapor deposition process. It is important for the catalyst material 104 to be electrically connected to the electrically conductive substrate 101.

This is made possible by virtue of the fact that the first insulation layer 102 deposited in process step b) (FIG. 1) does not cover the base 103b of the trench structure 100a, but rather has been deposited only at the side walls 103a, for example by what is known as a depletion process. If conformal deposition of the first insulation layer 102 on the inner surfaces of the trench structure 100a is provided, it is then necessary to introduce what is known as a spacer etch, i.e. a spacing has to be etched clear at the base 103b of the trench structure 100a in order for the catalyst material 104 to be introduced as shown in FIG. 2c).

Preferably, although not exclusively, the capacitor material 104 provided is a material from the iron group, such as for example Fe, Ni or Co, in such a manner that carbon nanotubes (CNTs) grow from this material. Furthermore, it is possible for the catalyst material provided to be a silicide-forming material, such as for example Au, Pt or Ti, from which silicon nanostructures, such as for example Si nanowires, grow.

By way of example, process step d) in FIG. 2 shows how a nanostructure 105 of this type is obtained in the center of the trench structure 100a.

It should be noted that the nanostructure 105 has been achieved simply by introducing the catalyst material 104 at the base 103b of the trench structure 100a and cannot be provided by the standardized lithography process. The resolution limits of the standardized lithography process are also reflected in the size of the trench structure 100a. Therefore, it is extremely advantageous in the method according to the invention that sub-lithographic processes, for example deposition of nanostructures, can be achieved when using a standardized lithography process.

The nanostructure 105, which may be formed as a carbon nanotube or as a silicon nanowire, now significantly increases the electrode surface area. It should be noted that process step d) shown in FIG. 2 is merely an example, i.e. it is possible to introduce a number of different nanostructures 105 in the trench structure 100a. These nanostructures do not have to be arranged precisely centrally in the trench structure 100a, but rather may also be provided at the side walls, on the first insulation layer 102. The nanostructures 105 result in a significant increase in the electrode surface area of the capacitive element forming the memory cell and therefore in a considerably increased storage capacity (charge storage capacity).

The final two process steps e) and f) required to complete an example of a memory cell will now be explained with reference to FIG. 3; the process steps shown in FIG. 3 follow the process steps c) and d) shown in FIG. 2. The electrode surface area, which has been increased by the nanostructure 105 provided in the trench structure 100a, must now likewise, as explained under process step b) (FIG. 1), be provided with an insulation layer. For this purpose, a second insulation layer 106 is applied, preferably by means of atomic layer deposition (ALD), in such a manner that the second insulation layer 106 is deposited on the nanostructure 105 which has grown in the trench structure 100a and on the base 103b of the trench structure 100a. It is preferable for the first insulation layer 102 and/or the second insulation layer 106 to consist of an $SiO_2$ material and/or an $HfO_2$ materials. Other materials which can be used for this purpose include $SiO_2$, SiN, $Ta_2O_5$, $Al_2O_3$, $HfO_2$, HfAlO(N), HfSiO(N), $La_2O_3$, LaAlO(N) etc.

Following the deposition of the second insulation layer illustrated in process step e) (FIG. 3), which likewise serves as a dielectric for the capacitive element forming the memory cell, in process step f) illustrated in FIG. 3 a counterelectrode is applied in the form of an electrically conductive layer 107. The electrically conductive layer 107 covers the entire surface of the first and second insulation layers 102 and 106.

Furthermore, it is possible for the material of the electrically conductive layer, preferably a polysilicon material or a metal, to fill the remaining space in the trench structure 100a.

With regard to the first and second capacitance curves 403 and 404 for different dielectrics of a specific capacitance 402 plotted against a radius ratio 401 given by $V=r_1/r_2$ illustrated in FIG. 4, reference should be made to the introduction to the description.

Although the present invention has been described above on the basis of preferred exemplary embodiments, it is not restricted to these embodiments, but rather can be modified in numerous ways.

Also, the invention is not restricted to the possible applications mentioned above.

List of Reference Symbols

In the figures, identical reference symbols denote identical or functionally equivalent components or steps.

100 Memory cell
100a Trench structure
101 Substrate
102 First insulating layer
103a Side walls
103b Base
104 catalyst material
105 Nanostructure
106 Second insulation layer
107 Electrically conductive layer
401 Radius ratio, V
402 Specific capacitance
403 First capacitance curve
404 Second capacitance curve

What is claimed is:

1. A method for fabricating memory cells, comprising:
providing an electrically conductive substrate;
etching a trench structure, which has side walls and a base, into the substrate;
depositing a first insulation layer at the side walls of the trench structure that does not cover the base;
depositing a catalyst material on the base of the trench structure, in such a manner that an electrical connection is provided between the electrically conductive substrate and the catalyst material;
growing at least one nanostructure within the trench structure, starting from and electrically connected to the catalyst material deposited on the base of the trench structure;
depositing a second insulation layer on the nanostructure which has grown in the trench structure and on the base of the trench structure; and
depositing an electrically conductive layer on the first insulation layer and second insulation layer, the electrically conductive layer extending into the trench to form an electrode.

2. The method according to claim 1, wherein the electrically conductive substrate is provided from silicon.

3. The method according to claim 1, wherein the etching of the trench structure which has the side walls and the base into the substrate is carried out by means of an anisotropic etching process.

4. The method according to claim 1, wherein the trench structure which has the side walls and the base in the substrate is designed to be substantially rectangular, round or elliptical in cross section.

5. The method according to claim 1, wherein the deposition of the first insulation layer is carried out at the side walls of the trench structure by means of a depletion process.

6. The method according to claim 1, wherein deposition of the catalyst material on the base of the trench structure is carried out by electrodeposition.

7. The method according to claim 1, wherein deposition of the catalyst material on the base of the trench structure is carried out by means of a vapor deposition process.

8. The method according to claim 1, wherein the first insulation layer, which is deposited at the side walls of the trench structure, is formed as a dielectric with a high dielectric constant.

9. The method according to claim 1, wherein the catalyst material which is deposited on the base of the trench structure includes at least one iron group in such a manner that the nanostructure is formed as at least one carbon nanotube.

10. The method according to claim 1, wherein the catalyst material which is deposited on the base of the trench structure includes a silicide-forming material such that the nanostructure is formed as at least one silicon nanowire.

11. The method according to claim 1, wherein the nanostructure starting from and electrically connected to the catalyst material deposited on the base of the trench structure grows centrally within the trench structure.

12. The method according to claim 1, wherein the nanostructure starting from and electrically connected to the catalyst material deposited on the base of the trench structure grows eccentrically inside the trench structure and/or at the side walls, which have been coated with the first insulation layer, of the trench structure.

13. The method according to claim 1, wherein the second insulation layer, which is deposited on the nanostructure grown in the trench structure and on the base of the trench structure, is formed as a dielectric with a high dielectric constant.

14. The method according to claim 1, wherein the first insulation layer and/or the second insulation layer are deposited by means of an atomic layer deposition process.

15. The method according to claim 1, wherein the first insulation layer and/or the second insulation layer are provided from at least one material selected from the group consisting of $SiO_2$, SiN, $Ta_2O_3$, $Al_2O_3$, $HfO_2$, HfAlO(N), HfSiO(N), $La_2O_3$, LaAlO(N).

16. The method according to claim 1, wherein the electrically conductive layer which is deposited on the first insulation layer and second insulation layer is provided from a polysilicon material or from a metal.

17. The method according to claim 1, wherein the electrically conductive layer which is deposited on the first insulation layer and second insulation layer also fills up space which remains in the trench structure after providing an electrically conductive substrate and depositing a second insulation layer have been carried out.

18. The method according to claim 1, wherein providing an electrically conductive substrate trench structure which has side walls and a base into the substrate is replaced by the forming a cup or crown structure from material which is applied to the substrate, with the trench structure merging into a cup structure.

19. The method according to claim 18, wherein the cup or crown structure is provided by means of an anisotropic etching process from material which is applied to the substrate.

* * * * *